United States Patent
Motoyama et al.

(12) 
(10) Patent No.: US 6,553,274 B1
(45) Date of Patent: Apr. 22, 2003

(54) METHOD FOR DESIGNING RETICLE, RETICLE, AND METHOD FOR MANUFACTURING SEMICONDUCTOR DEVICE

(75) Inventors: Takushi Motoyama, Kawasaki (JP); Hideki Harada, Kawasaki (JP); Takayuki Tsuru, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/482,519

(22) Filed: Jan. 14, 2000

Related U.S. Application Data

(62) Division of application No. 08/546,088, filed on Oct. 20, 1995.

(30) Foreign Application Priority Data

Dec. 12, 1994 (JP) .............................................. 6-307973

(51) Int. Cl.⁷ .............................................. G06F 19/00
(52) U.S. Cl. .......................................... 700/121; 430/5
(58) Field of Search .............................. 700/121, 123, 700/125, 97, 117; 430/5

(56) References Cited

U.S. PATENT DOCUMENTS

| | | | |
|---|---|---|---|
| 4,949,162 A | * 8/1990 | Tamaki et al. | 257/499 |
| 5,027,188 A | * 6/1991 | Owada et al. | 257/758 |
| 5,281,555 A | * 1/1994 | Cho | 438/625 |
| 5,289,422 A | * 2/1994 | Mametani | 365/210 |
| 5,357,140 A | * 10/1994 | Kozasa | 257/752 |
| 5,436,097 A | * 7/1995 | Norishima et al. | 430/5 |
| 5,441,915 A | * 8/1995 | Lee | 438/631 |

FOREIGN PATENT DOCUMENTS

| | | |
|---|---|---|
| JP | 54-69393 | 6/1979 |
| JP | 57-205886 | 12/1982 |
| JP | 63-211739 | 9/1988 |
| JP | 63-236319 | 10/1988 |
| JP | 04048715 A | 2/1992 |

OTHER PUBLICATIONS

S. Mahajan, et al., "Concise Encyclopedia of Semiconductor Materials & Related Technologies", pp. 170–171, published by Pergamon Press., 1992.

Examiner 8530 2M00, Office Action from Japanese Patent Office, Jul. 31, 2001 (2 pgs.) plus translation (1 pg.).

* cited by examiner

*Primary Examiner*—Leo Picard
*Assistant Examiner*—Zoila Cabrera
(74) *Attorney, Agent, or Firm*—Staas & Halsey LLP

(57) ABSTRACT

A reticle is designed with a method including generating first dummy patterns with intervals from main patterns. Each of the first dummy patterns are divided into a plurality of spaced apart second dummy patterns and then each of the second dummy patterns are measured to find third dummy patterns having widths and areas below smallest allowable values. The third dummy patterns are then respectively connected to second dummy patterns which are adjacent to the third dummy patterns by generating a connecting dummy pattern. Selective non-connected third dummy patterns are removed. The first dummy patterns are divided into a plurality of second dummy patterns by vertical and horizontal strip lines crossing the first dummy patterns.

6 Claims, 14 Drawing Sheets

FIG. 3A
(PRIOR ART)
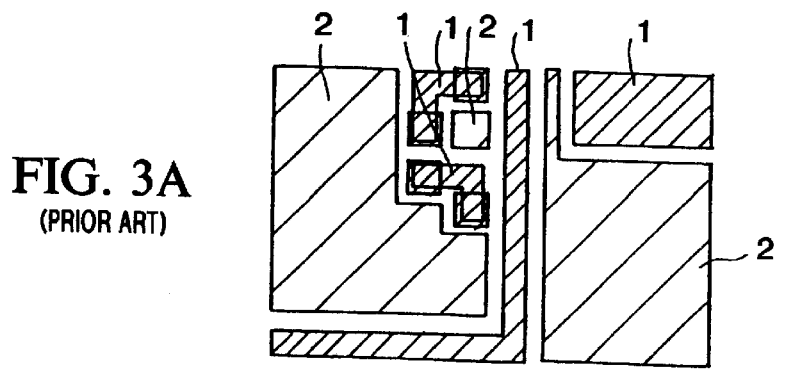
FIG. 3B
(PRIOR ART)
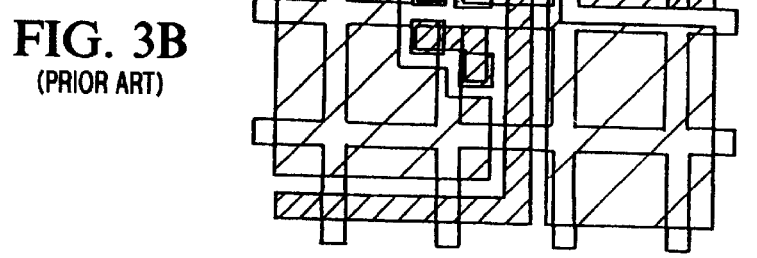
FIG. 3C
(PRIOR ART)
FIG. 3D
(PRIOR ART)
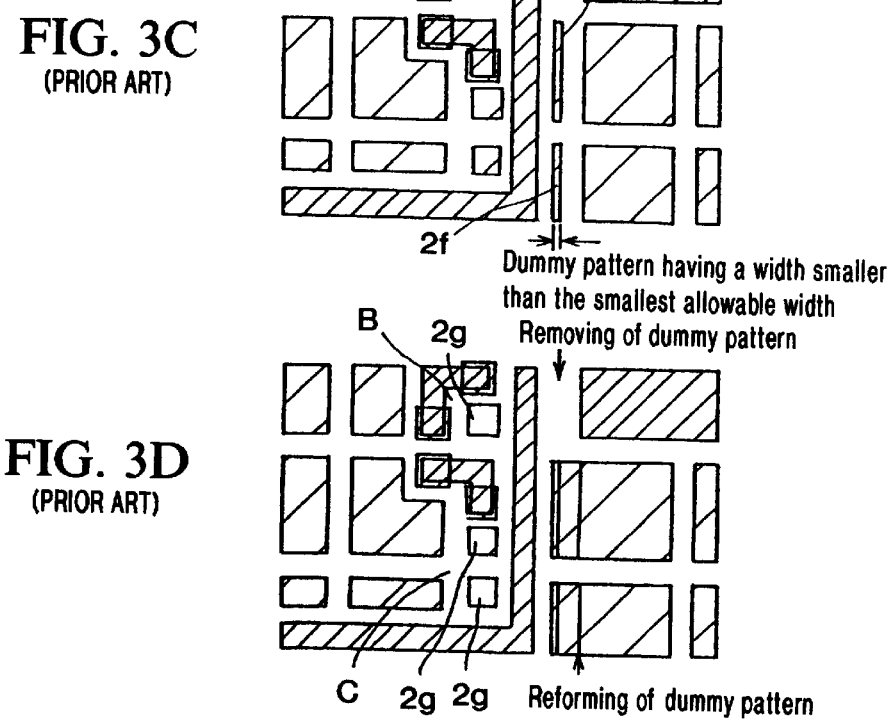

Dummy pattern having a with smaller than the smallest allowable width
Removing of dummy pattern Reforming of dummy pattern Deposition of dummy pattern of 0.94 x 0.94 being possible Deposition of dummy pattern of 0.94 x 0.94 being impossible Focal point ±0.0

Focal points −0.3

Focal points +0.3

−0.6

+0.6

−0.9

+0.9

+1.2

Focal point ±0.0

Focal points −0.3

Focal points +0.3

−0.6 Pattern-missing

+0.6

−0.9 Pattern-missing

+0.9 Pattern-degradation

+1.2 Pattern-missing

METHOD FOR DESIGNING RETICLE, RETICLE, AND METHOD FOR MANUFACTURING SEMICONDUCTOR DEVICE

This application is a divisional of application Ser. No. 08/546,088, filed Oct. 20, 1995, now allowed.

BACKGROUND OF THE INVENTION

1. Field of the Invention

This invention relates to a method for designing a reticle, a reticle, and a method for manufacturing a semiconductor device. More particularly, it relates to a method for designing a reticle including a step of generating a dummy pattern, a reticle, and a method for manufacturing a semiconductor device including a step of patterning a interconnection layer and a dummy layer by the use of the reticle.

2. Description of the Prior Art

Owing to the trend of data processing instruments toward functional exaltation and miniaturization, various semiconductor IC devices (LSI's) which are the components of such instruments have been naturally urged to satisfy operational enhancement and dimensional reduction as essential requirements. To satisfy these requirements, the transistor circuits to be formed on such semiconducting substrates as are made of silicon or gallium arsenide are being subjected to increasingly generous integration and miniaturization.

The fine circuits which are used for these LSI's are formed by repeating the following plurality of steps of producing thin film patterns.

To be specific, the plurality of steps comprise the steps of superposing on a substrate a thin film such as a conducting film, a semiconducting film, or an insulating film which gives rise to a circuit pattern, then applying a resist to the surface of the thin film, projecting a beam of light through the pattern of a reticle on a reduced scale onto the resist thereby effecting exposure of the resist, developing the exposed resist, curing the resist, and etching the thin film as masked with the remaining pattern of the resist.

The patterns which are formed in the reticle include various electrodes such as gates, sources, and drains, a interconnection, and contact holes in a MOS transistor, for example.

For the purpose of ensuring highly accurate formation of a pattern designed to produce a fine semiconductor integrated circuit, the exposure and the development discharge important roles among other steps mentioned above. The resist is heavily affected by a difference of level on the surface of the thin film. When the surface of a substrate to which the resist is applied happens to contain large undulations, the resist applied thereto produces fluctuations of film thickness commensurate with the undulations. As a result, the pattern is suffered to produce fluctuations of width proportionate to the undulations owing to the interference between an incident light and a reflected light. If the undulations of the surface of the substrate are still larger, the beam of light used for the exposure will be defocussed possibly to the extent of deforming the pattern.

Various methods have been proposed for overcoming the disadvantages which originate in such surface undulations as mentioned above. Among them is counted a method which, at the same time that interconnection patterns 1a through 1c are distributed as shown in FIG. 1A, comprises causing dummy patterns 2a through 2c made of the same material as the interconnection patterns 1a through 1c to be laid out between the interconnection patterns 1a through 1c (referred to hereinafter as "interconnection dummy method"). The dummy patterns 2a through 2c are separated from the interconnection patterns 1a through 1c. When interconnection layers 11a through 11c are formed by the use of a reticle on a semiconducting substrate 10, the fluctuations of film thickness of the resist which are generated depending on the presence and absence of the interconnection layers 11a through 11c are greatly alleviated.

Further, the interconnection dummy method is a highly effective means to flatten an insulating film 13 which covers the interconnection layers 11a through 11c, namely to alleviate the undulations of the surface of the substrate, as shown FIG. 1B.

JP-A-54-69393 discloses a method which comprises coating a substrate with strips of resist film thereby forming a interconnection metal film and subsequently separating the interconnection metal film by the liftoff technique into interconnection parts and non-interconnection parts as opposed to each other across a groove. Then, JP-A-57-205, 886 discloses a method which, in the production of a magnetic bubble memory chip, comprises causing dummy patterns to be formed around conductor patterns intersecting transfer patterns at the same time that the conductor patterns are formed. FIG. 1B is a cross section of a semiconductor device corresponding to the cross section taken through FIG. 1A showing the reticle along the line I—I. The reference numeral 14 stands for a SOG film. Since the interconnection dummy method obviates the necessity for incorporating any special step for flattening the film surface in the process thereof as described above, it proves more advantageous than the other flattening methods in terms of throughput and cost.

The design of the dummy patterns mentioned above is attained according to the following procedure as depicted in the flow chart of FIG. 2. The states in which the interconnection patterns and the dummy patterns are formed during this procedure are shown in the plan views of FIGS. 3A through 3D.

First, the interconnection patterns 1 are laid out as shown in FIG. 3A and the dummy patterns 2 are disposed as separated by a fixed distance from the corresponding interconnection patterns 1. Since the continuous areas of the dummy patterns 2 are unduly wide, they can cause a short circuit between the interconnection patterns 1. Thus, the dummy patterns 2 are divided into a plurality of portions. Specifically, a latticelike pattern 3 is superposed on the dummy patterns 2 as shown in FIG. 3B. The portions of the dummy patterns 2 which are consequently overlaid by the latticelike pattern 3 are removed to obtain a group of divided and separated dummy patterns 2d as shown in FIG. 3C. Incidentally, the width of the linear portions of the latticelike pattern 3 is equal to or larger than the width of the interconnection patterns 1.

Subsequently, the widths of the separated dummy patterns 2d are measured to find whether or not any of the patterns 2d has a width falling short of the smallest allowable width a. The term "smallest allowable width a" refers to the smallest width of the dummy patterns 2d that is allowed from the standpoint of design of pattern. If the width of the dummy patterns 2d is not more than the smallest allowable width a, the dummy layers based on the dummy patterns 2d will not be formed as expected or the dummy layers will become unduly thin and will peel off.

When none of the dummy patterns 2d is found to have a width smaller than the smallest allowable width a, the design of the dummy patterns 2d and the interconnection pattern 1 is terminated.

Conversely, when dummy patterns 2e and 2f are found to have a width smaller than the smallest allowable width a, the dummy pattern 2 which adjoined the dummy pattern 2f and which has been removed as shown in FIG. 3D is restored. Then, the pattern widths are measured again. When this measurement finds any of the dummy patterns to have a width smaller than the smallest allowable width a, that particular dummy pattern 2e is removed. This step completes the design of dummy patterns and interconnection patterns.

Incidentally, the reason for the unification of the dummy pattern 2f of a width smaller than the smallest allowable width a with the other dummy pattern 2d is that, where areas devoid of a dummy pattern are continued and interconnection layers are actually formed based on these areas, the insulating film to be formed in these areas is liable to produce depressed portions therein. Then, the reason for the removal of the dummy patterns 2e having a width smaller than the smallest allowable width a is that, when dummy layers based on the dummy patterns 2e are suffered to survive, these dummy patterns separate during the manufacture of the relevant semiconductor device and ultimately partake in causing such troubles as a short circuit in the device.

A reticle is produced on the basis of the design data of these dummy patterns and interconnection patterns configured as described above, and this reticle is used for the exposure of the resist.

In the case under discussion, there arises the possibility that dummy patterns 2g which equal the square of the smallest allowable width a, namely a×a, will exist at the sites B and C, for example, as shown in FIG. 3D.

In this case, when the interconnection layers and the dummy layers are patterned, the dummy layers produced in the areas which coincide with the dummy patterns 2g assume the shape of a slender column and tend to peel readily from the substrate. Further, the dummy patterns in this case possibly escape being transferred and impart a missing portion to a produced pattern. Particularly when the dummy patterns escape being transferred in areas in which a plurality of dummy patterns 2g of the shape of the square of a×a are arranged as shown in FIG. 3 D, since the formation of dummy layers is not attained and the distances between the interconnection layers in the areas are unduly large, the problem ensues that the interlayer insulating films for coating the interconnection layers in the areas will not be flattened.

SUMMARY OF THE INVENTION

An object of this invention is to provide a method for designing a reticle which allows the interlayer insulating films for coating the interconnection layers to be flattened while precluding the impartation of a missing portion to a produced pattern during the transfer of dummy patterns and repressing the formation of unduly narrow patterns and precluding the occurrence of particles due to accidental separation of a conductive pattern, a reticle, and a method for manufacturing a semiconductor device.

The method of this invention for forming a pattern comprises dividing each of first dummy patterns into a plurality of second dummy patterns, seeking third dummy patterns having a width and an area smaller than the respective smallest allowable values, and enlarging each third dummy pattern in width and in area by means of generating a connection dummy pattern on border of the third dummy pattern and the adjacent second dummy pattern to connect them each other, and further removing third dummy patterns which have isolated from the rest of the second dummy patterns. The term "smallest allowable area" refers to the smallest area that the dummy patterns occupy in a plane and that is allowed from the viewpoint of designing a pattern. If dummy patterns have an area smaller than the smallest allowable area, the beam of light used for the exposure will be defocussed as by the difference of level and the dummy layers based on such dummy patterns will be consequently narrowed and suffered to peel off.

When those patterns of the shape of the square of the smallest allowable width which would be left unremoved by the conventional method happen to dissatisfy the standard of the smallest allowable area, therefore, they are enlarged in area in the present invention. Since this enlargement results in widening the range of the focal point of exposure in which the transfer pattern is infallibly allowed to remain, the dummy patterns can be transferred without fail onto a given substrate even when the difference of level consequently produced on the substrate is suffered to defocus the beam of light for exposure. The method under discussion has no need in particular to form new patterns by restoring removed dummy patterns as continued dummy patterns.

Further, the method is capable of precluding the formation of an unduly thin dummy layer due to the thinning of a transfer pattern because it implements removal of isolated dummy patterns which satisfy the standard of width and yet dissatisfy the standard of area.

According to the method of this invention for manufacturing a semiconductor device, the range of the focal point of exposure in which the transfer pattern is allowed infallibly to remain is enlarged because it utilizes a reticle which is produced by the method of pattern formation described above. Even when the beam of light for exposure is defocussed by the difference of level suffered to occur in the surface of the substrate, therefore, the dummy patterns can be transferred without fail on the substrate and the occurrence of a missing portion from a produced pattern can be precluded and the insulating film coating the interconnection layer can be made smooth.

Further, the formation of an unduly thin dummy layer due to the thinning of a transfer pattern based on an isolated dummy pattern satisfying the standard of width and yet dissatisfying the standard of area because the isolated dummy pattern is removed by the method under discussion. As a result, the short circuit which is otherwise induced by the peeling of a conductive dummy layer can be precluded.

BRIEF DESCRIPTION OF THE DRAWINGS

FIGS. 3A–3D is a plan view showing another example of the conventional method for forming a pattern.

DESCRIPTION OF THE PREFERRED EMBODIMENT

Figure 1A:
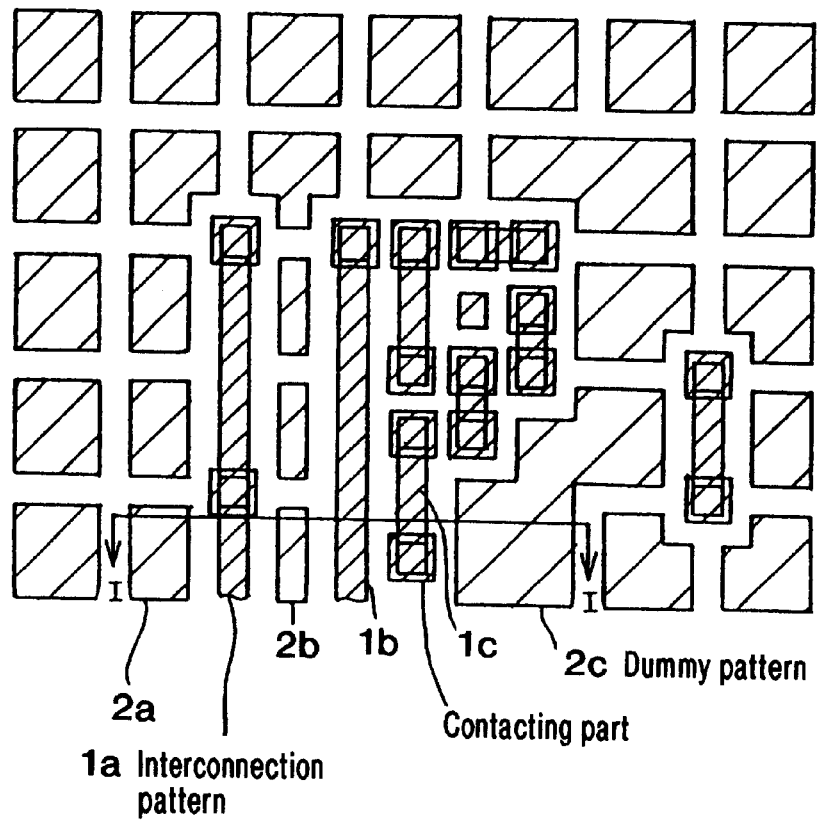
FIGS. 1A–1B is plan view showing a reticle according to a conventional example and a cross section showing a semiconductor device possessed of an interconnection layer and a dummy layer.
Figure 1B:
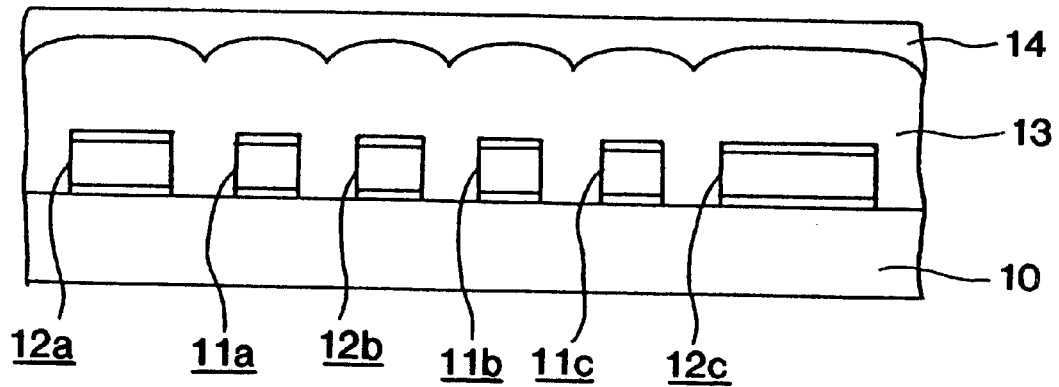
Figure 2:
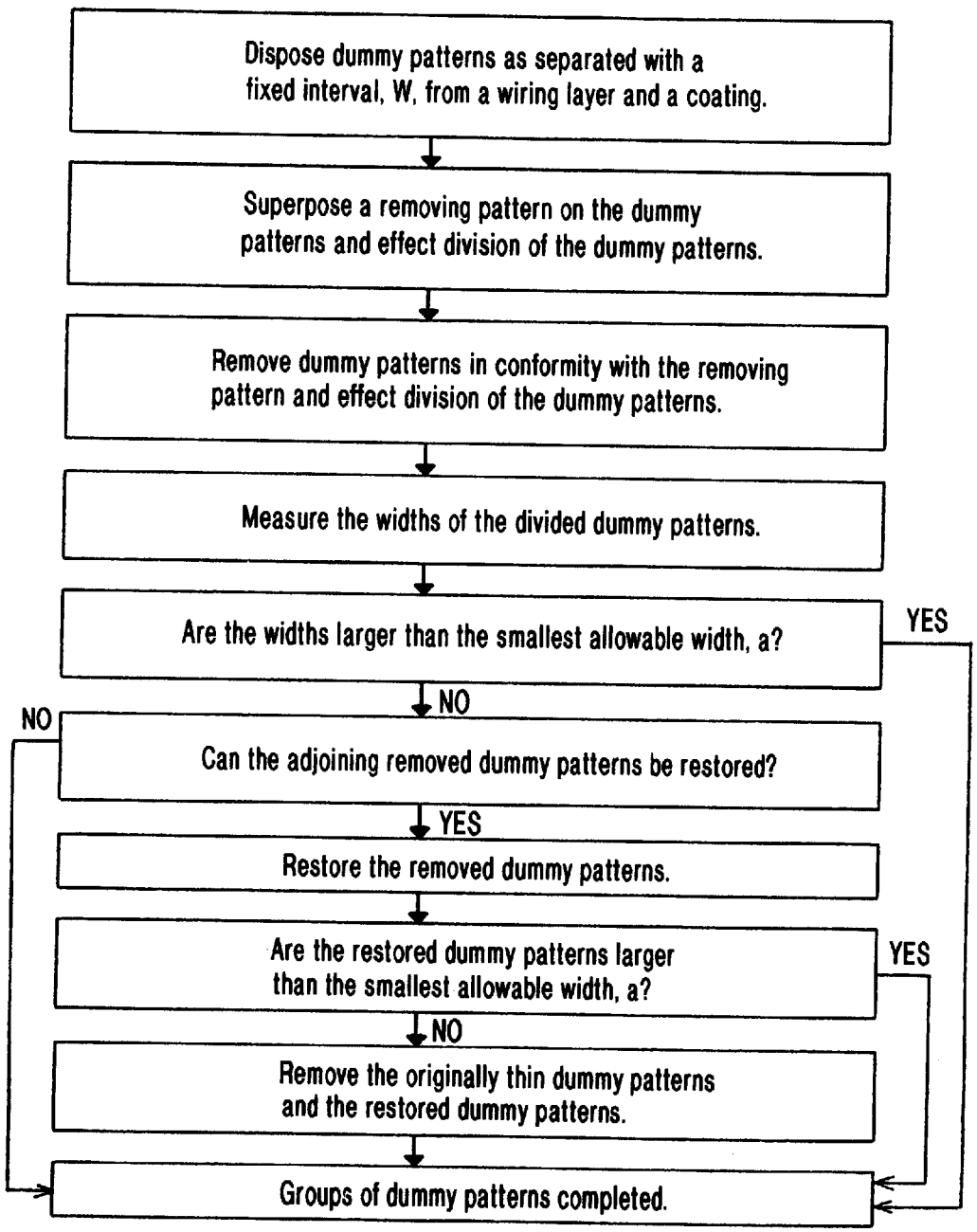
FIG. 2 is a flow chart showing an example of the conventional method for forming a pattern.

Now, an embodiment of this invention will be described below with reference to the annexed drawings.

First, the cause for the occurrence of such defects as a missing portion in a pattern in the transfer of dummy patterns and the measure to cope therewith will be described specifically based on test results.

FIGS. 11A–11H are views is a views showing the planar shapes of the transfer patterns obtained in the transfer of a square pattern onto a resist film at varying focal points of exposure.

With a high-pressure mercury-vapor lamp [0.365 $\mu$m (i line)] used as a light source for exposure, a pattern of the square of 0.55 $\mu$m was transferred onto a resist film. The focal point of exposure was changed with an increment of 0.3 $\mu$m from –0.9 $\mu$m to +1.2 $\mu$m.

The test results indicate that the planar shapes of the transferred patterns approximated a circle with the corners thereof rounded and the transferred pattern obtained when the focal point of exposure was 0 $\mu$m had the largest area. The transfer patterns grew increasingly thin as the relevant focal points of exposure deviated more toward plus or minus. The corners of the transferred patterns were rounded because the influence of the effect of interference between the pattern width and the wavelength of the light of exposure manifested itself prominently in proportion as these magnitudes approximated each other.

From the test results given above, it is learned that a square pattern has a very small allowance for the focal depth of the exposure and suffers a large deviation of the focal point during the exposure. When the focal point of the beam of light for exposure is largely deviated as by a difference in level of the surface, therefore, the transferred pattern is likely to thin and peel off the substrate and consequently sustain a missing part therein.

The analysis of the test results indicates that when a high-pressure mercury-vapor lamp [0.365 $\mu$m (i line)] is used as a light source for exposure and expected to warrant an allowance of not less than 1 $\mu$m of the focal depth, the square pattern to be used ought to have the side, a, thereof so set as to satisfy the condition, a $\geq$ 0.7 $\mu$m, depending on the material of which the substrate is made, the particular kind of exposure device, and the condition of patterning a resist film. Even when the width of the pattern is not more than 0.7 $\mu$m, the same effect as remarked above is attained by increasing the length of the pattern.

FIGS. 10A–10H are views is a view showing the planar shapes of the transfer patterns obtained in the transfer of a rectangular pattern onto a resist film at varying focal points of exposure. With a high-pressure mercury-vapor lamp [0.365 $\mu$m (i line)] used as a light source for exposure, a rectangular pattern measuring 0.55 $\mu$m×1.63 $\mu$m was transferred onto a resist film. The focal point of exposure was changed with an increment of 0.3 $\mu$m from –0.9 $\mu$m to +1.2 $\mu$m.

The test results indicate that the transferred patterns assumed a semicircular shape with the two opposite ends in the longitudinal direction thereof rounded and the transferred pattern obtained when the focal point of exposure was 0 $\mu$m had the largest area. The transfer patterns grew increasingly thin and short as the relevant focal points of exposure deviated more toward plus or minus.

With the square pattern of FIG. 11, transferred patterns which proved usable were obtained when the focal point of the light for exposure was in the range of from –0.3 $\mu$m to +0.6 $\mu$m. In contrast, with the rectangular pattern of FIG. 10, usable transferred patterns were obtained when the focal point was in the range of from –0.9 $\mu$m to +1.2 $\mu$m. This fact indicates that the range of allowable variation in the focal point of the beam of light for exposure was greater in the rectangular pattern than in the square pattern.

As noted above, when a rectangular pattern on a reticle is transferred at a varying focal point onto a substrate, the transferred patterns assume such shapes that their terminals are increasingly rounded and retracted in proportion as the width of the interconnection pattern and the wavelength of the beam of light for exposure approximate each other. In the case of a square pattern, therefore, the transferred patterns assume shapes close to a circle. The degradation of pattern shapes is conspicuous in the patterns transferred from a square pattern as compared with that in the patterns transferred from a rectangular pattern. It is, therefore, advantageous for a dummy pattern to have a rectangular shape such that the patterns transferred therefrom, though allowed to be degraded, must not produce any missing part therein. When a rectangular pattern is given such dimensions that the width along the minor side thereof equals the interconnection width, for example, the length along the major side thereof depends on the ratio of the wavelength of the beam of light for exposure to the minor side and the kinds of resist process. The length of the major side so set must be increased in proportion as the ratio of the width of the minor side to the wavelength of the beam of light for exposure decreases.

Figure 6:
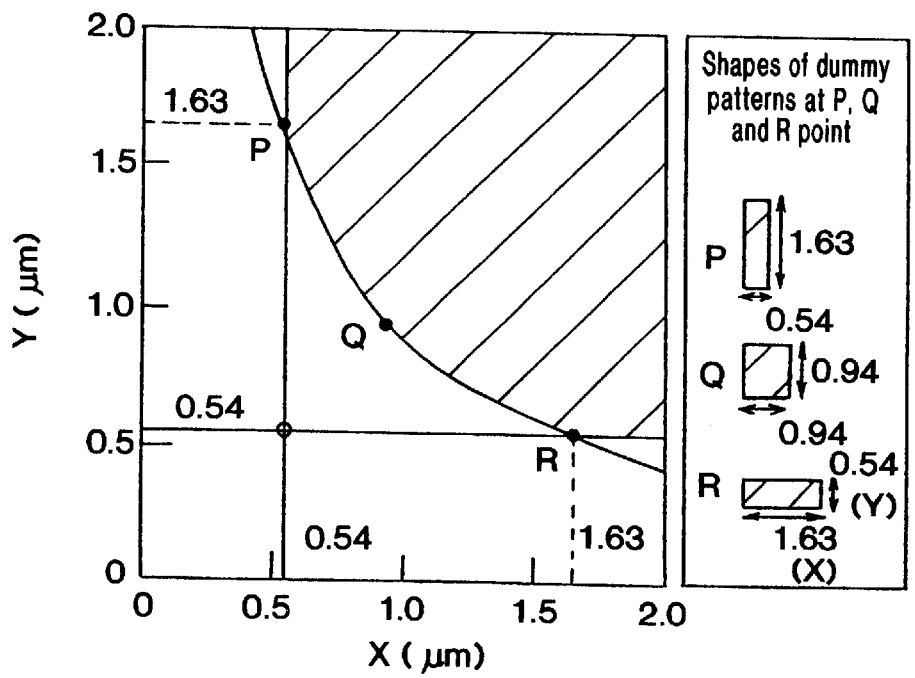
FIG. 6 is a characteristic diagram showing an allowable dimensional range expressed on the basis of the smallest allowable width a and the smallest allowable area S of dummy patterns obtained in a method for forming a pattern in accordance with one embodiment of this invention.

FIG. 6 is a characteristic diagram showing the allowable range for a dummy pattern in a rectangular shape whose width is not less than the smallest allowable width, a, and whose area is not less than the smallest allowable area, S, on a reticle. The vertical axis of the graph represents the length, Y ($\mu$m), of the dummy pattern and the horizontal axis thereof the width, W ($\mu$m), of the dummy pattern.

The allowable range which is based on the smallest allowable width, a (=0.54 $\mu$m), and the smallest allowable area, S (=0.88 $\mu$m$^2$), is indicated with hatches. Advantageously, the smallest allowable width, a, is so set as to be practically equal to or smaller than the width of the interconnection pattern. The smallest allowable area, S, ought to be commensurate with the smallest allowable width, a, of the pattern so that the transferred pattern will have no defect.

According to FIG. 6, when the width of the dummy pattern is the smallest allowable width, a, the allowable length of the dummy pattern is not less than 1.63 μm.

Figure 7A:
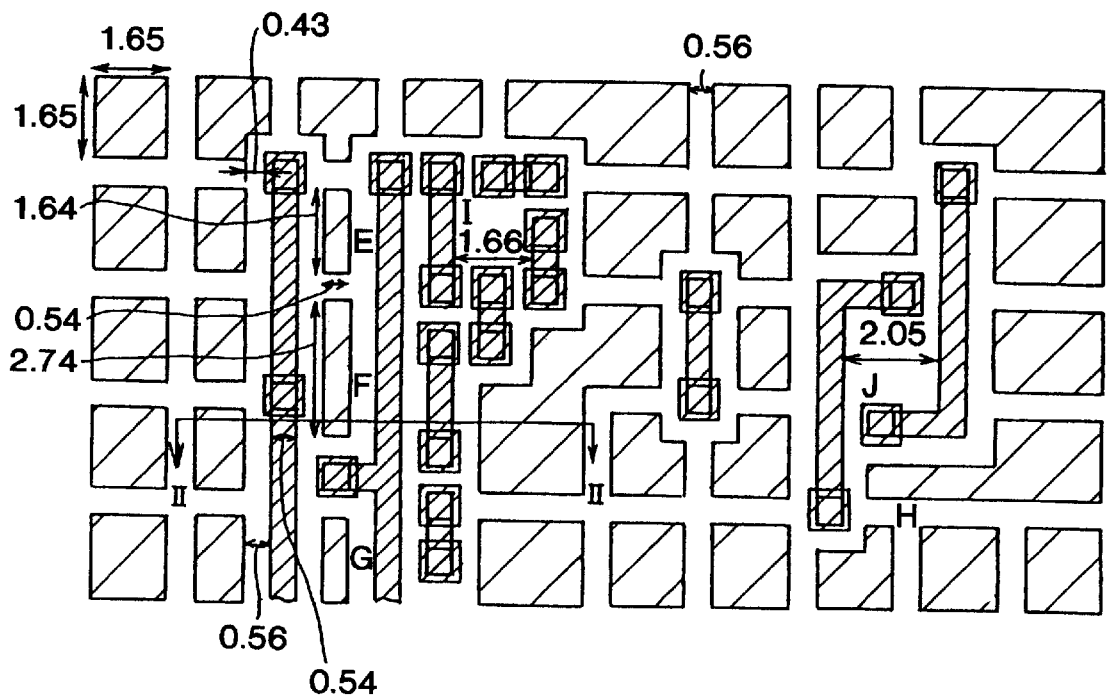
FIGS. 7A–7C is a plan view showing a reticle in accordance with one embodiment of this invention.
Figure 7B:
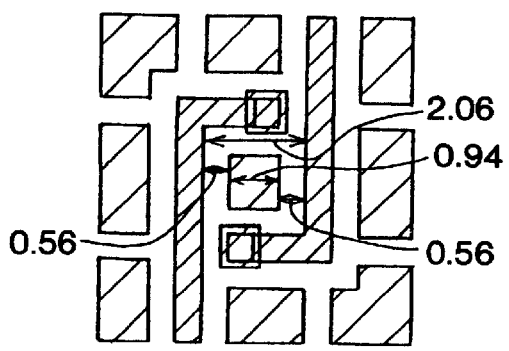
Figure 7C:
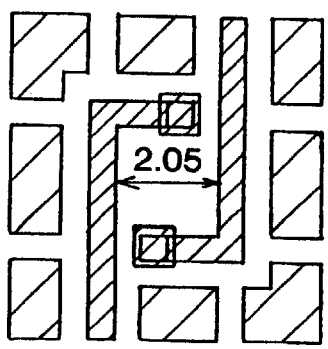

Further, FIG. 6 indicates the presence of a wide range for the intervals between the interconnection patterns because all areas smaller than the smallest allowable area, S, are excluded. For example, a dummy pattern measuring 0.94 μm×0.94 μm exists in the area interposed between interconnection patterns separated by an area of 2.06 μm×2.06 μm as shown in FIG. 7B, whereas no dummy pattern exists in the area interposed between interconnection patterns separated by an area of 2.05 μm×2.05 μm as shown in FIG. 7C. A depression measuring approximately 2.05 m×2.05 μm occurs between two adjacent interconnection layers onto which such a interconnection pattern as mentioned above has been transferred. It can be flattened easily as compared with a depressed area in which two long interconnection layers are parallelled with an interval of the same size. This flattening can be attained, for example, with a spin on glass (SOG) film.

Now, the method for forming a pattern according to this invention will be described below based on the test results remarked above.

Figure 4A:
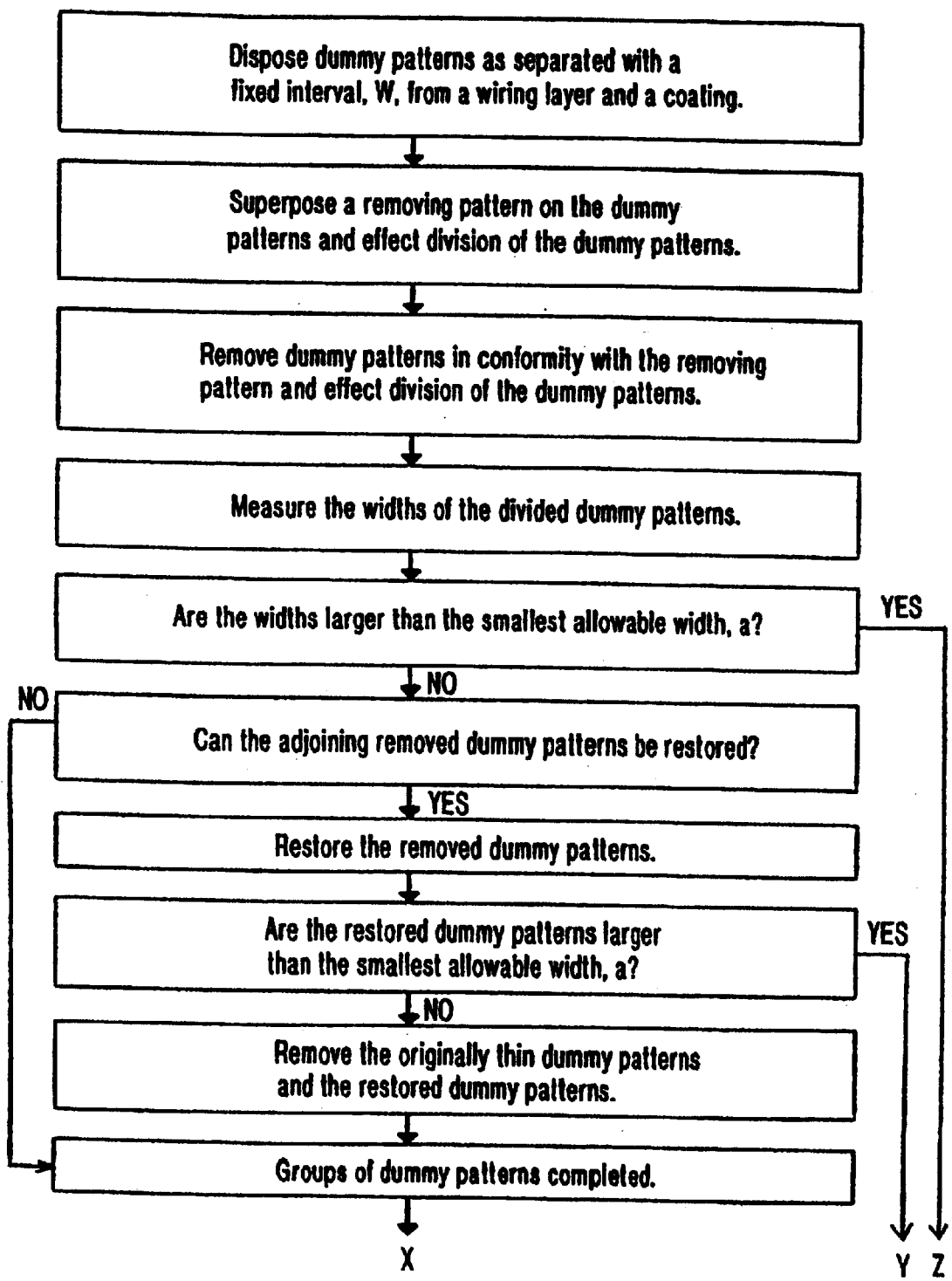
FIGS. 4A–4B is a flow chart showing a method for forming a pattern in accordance with one embodiment of this invention.
Figure 4B:
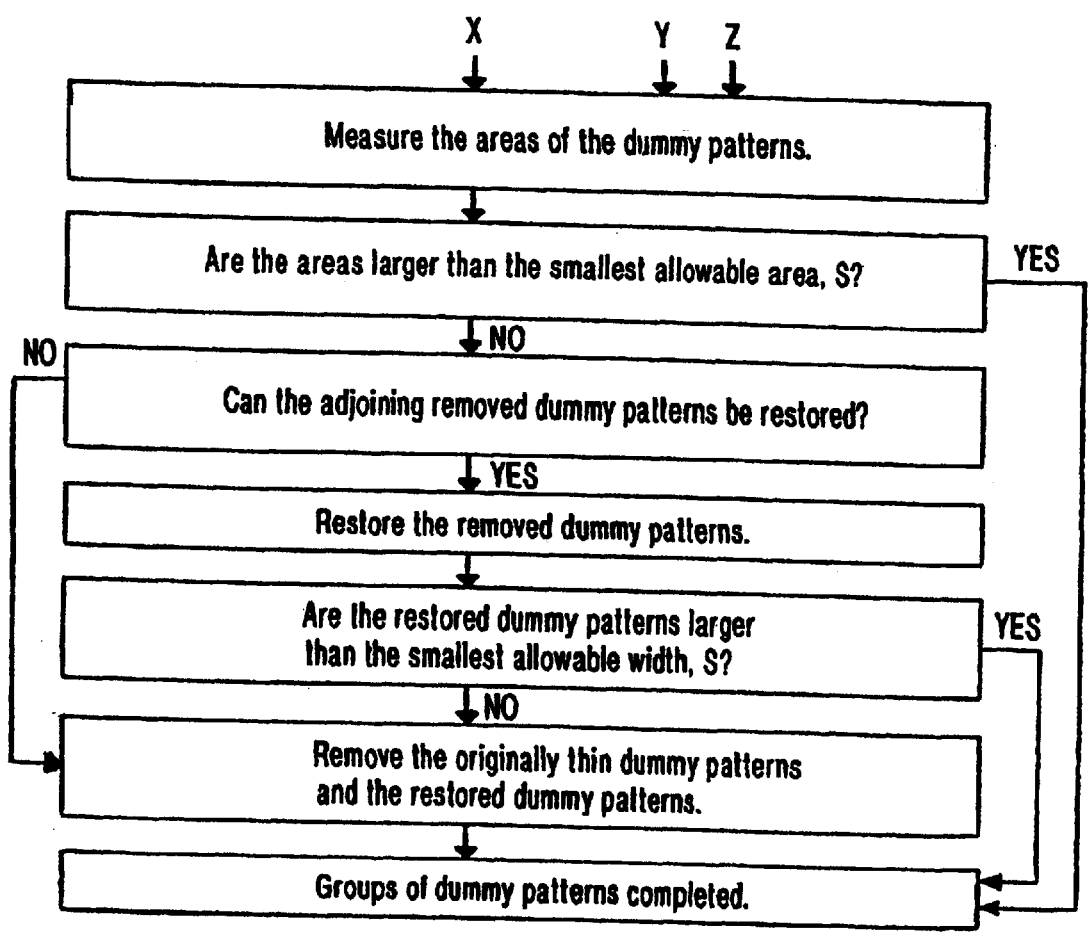

FIG. 4A and FIG. 4B are flow charts showing a process for forming a pattern according to an embodiment of this invention. FIGS. 5A through 5E are plan views showing the planar shapes which are assumed by the pattern in the process of formation thereof by the method mentioned above.

Figure 5A:
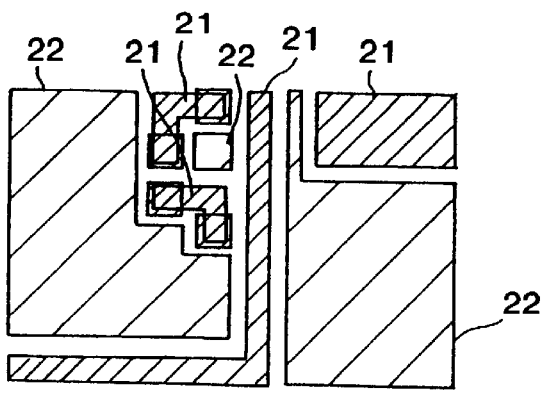
FIGS. 5A–5E is a plan view showing a method for forming a pattern in accordance with one embodiment of this invention.

First, interconnection patterns (main patterns) 21 are laid and dummy patterns 22 are disposed at a fixed interval, W, from the interconnection patterns 21 as shown in FIG. 5A.

Figure 5B:
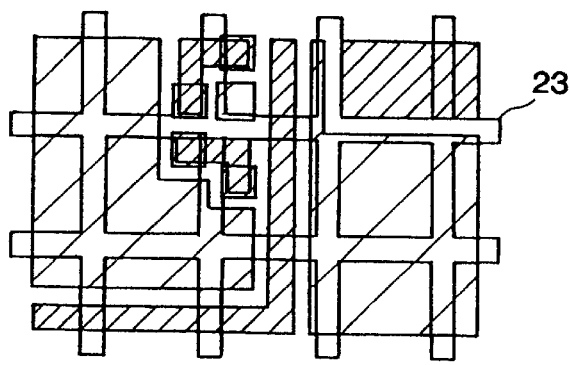
Figure 5C:
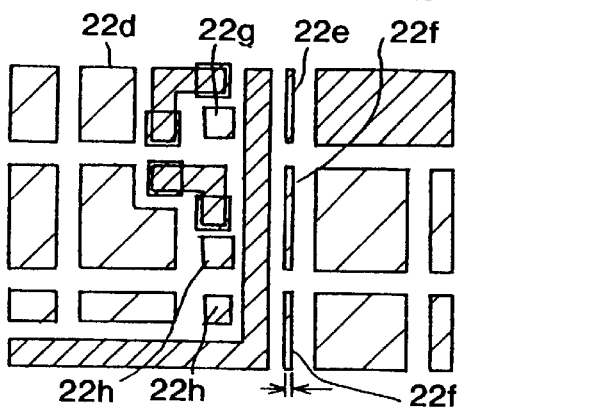

Then, for the purpose of dividing the dummy patterns 22 each into a plurality of portions, a latticelike pattern (reticular pattern) 23 is superposed on the dummy patterns 22 as shown in FIG. 5B and subsequently the portions of the dummy patterns 22 which are overlaid by the superposed latticelike pattern 23 are removed as shown in FIG. 5C to form divided and mutually separated groups of dummy patterns 22d through 22h. In this case, the width of the latticelike patterns 23 equals the width of the interconnection patterns 21.

The widths of the separated dummy patterns 22d through 22h are measured to find whether or not any of the widths falls short of the smallest allowable width, a.

When the absence of a dummy pattern having a width smaller than the smallest allowable width, a, is confirmed, the process is immediately advanced to the work of measuring the areas of the dummy patterns.

Figure 5D:
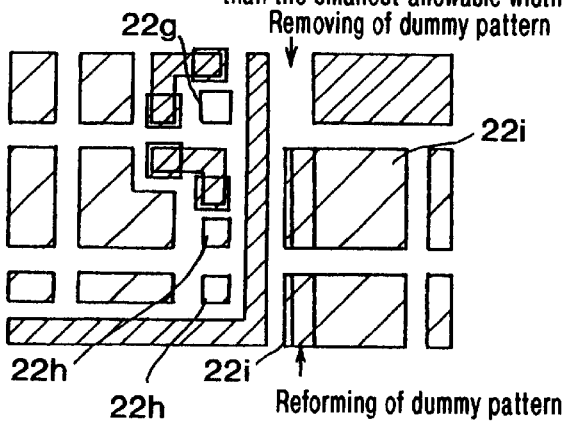

Conversely, when the presence of dummy patterns 22e and 22f having widths smaller than the smallest allowable width, a, is confirmed, dummy patterns 22i which adjoined them and which have been removed are to be examined prior to the advance of the process to find whether or not they can be restored and the dummy patterns having smaller widths are to be either widened or removed. In the areas in which only the interconnection patterns 21 are present and no dummy pattern 22d is present in the adjoining areas and the removed dummy patterns 22i cannot be restored as shown in FIG. 5C and FIG. 5D, for example, the dummy patterns 22e are to be removed. In the areas in which the dummy patterns 22d are present in the adjoining areas and the removed dummy patterns 22i can be restored, the removed dummy patterns 22i are to be restored and the dummy patterns 22f of smaller widths and the dummy patterns 22d adjoining thereto are to be joined. Then, the widths of the dummy patterns are measured once again. When this measurement happens to detect the presence of dummy patterns having widths smaller than the smallest allowable width, a, these dummy patterns are to be removed.

Subsequently, the areas of the dummy patterns 22d, 22g, and 22h are measured to find whether or not any of the dummy patterns has an area smaller than the smallest allowable area, S.

When the absence of a dummy pattern having an area smaller than the smallest allowable area, S, is confirmed, the formation of the groups of dummy patterns is completed.

Figure 5E:
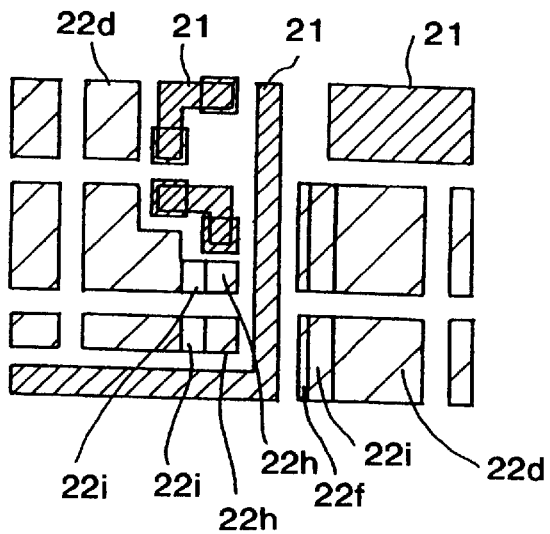

Conversely, when the presence of dummy patterns 22g and 22h having widths smaller than the smallest allowable area, S, is confirmed, the removed dummy patterns 22i are to be examined to find whether or not they can be restored and the dummy patterns 22g and 22h having smaller areas are to be either widened or removed. In the areas in which only the interconnection patterns 21 are present and no dummy pattern is present in the adjoining areas and the removed dummy patterns 22i cannot be restored as shown in FIG. 5E, the dummy patterns 22g are to be removed. Conversely, in the areas in which the dummy patterns 22d are present in the adjoining areas and the removed dummy patterns 22i can be restored, the removed dummy patterns 22i are to be restored and the dummy patterns 22h having smaller areas and the dummy patterns 22d adjoining thereto are to be joined. Then, the areas of the dummy patterns are measured once again. When this measurement happens to detect the presence of dummy patterns having areas smaller than the smallest allowable area, S, these dummy patterns are to be removed.

The groups of dummy patterns are completed as described above.

According to the method of this invention for forming a pattern as described in the embodiment above, the dummy patterns 22 are partially removed to obtain separated groups of dummy patterns 22d through 22h and these separated groups of dummy patterns are examined to determine not merely the smallest allowable width, a, but also the smallest allowable area, S, and, when the determination results in detecting dummy patterns 22e through 22h having widths and/or areas smaller than the relevant standards, the removed dummy patterns 22i are restored to enlarge the dummy patterns 22f and 22h of smaller widths and/or areas in width or area. When the smallest allowable width, a, and the smallest allowable area, S, are below the respective standards and the relevant removed dummy areas cannot be restored, the dummy patterns 22e and 22g having smaller widths and/or areas are to be removed.

When the patterns 22h which have the square of the smallest allowable width, a, as the area thereof and which are allowed to remain intact by the conventional method fail to satisfy the standard of the smallest allowable area, S, their areas are to be enlarged. Since this enlargement results in widening the range of the focal point of the beam of light for exposure in which the transferred patterns remain without fail, the dummy patterns can be transferred infallibly on a given substrate even when a difference of level in the surface of the substrate defocuses the beam of light for exposure.

Further, the formation of dummy layers which have been thinned by the thinning of the transferred patterns can be precluded because the isolated dummy patterns 22g which satisfy the standard of width and do not satisfy the standard of area are removed. Such electrical defects as short circuits which are causable by separated conductive substances, therefore, can be prevented.

The embodiment given above has portrayed a case of restoring the removed dummy patterns 22i and using them as connecting dummy patterns. Optionally, new patterns may be formed instead.

The method under discussion has been described as using latticelike patterns as the reticular patterns 23. Otherwise, a pattern removing part which is formed in some other shape may be used instead.

Further, the method has been described as forming the dummy patterns in a rectangular shape and setting the smallest allowable width, a, at 0.54 $\mu$m and the smallest allowable area, S, at 0.88 $\mu m^2$. It is allowable to form the dummy patterns in some other shape or to alter them suitably depending on the kind of light for exposure and the kind of resist.

The present invention has been described as embodied in a method for forming a pattern with interconnection patterns as main patterns. It can be embodied in a method using some other patterns instead.

Now, the reticle which is produced based on the groups of dummy patterns and the interconnection patterns mentioned above will be explained below with reference to FIG. 7A. FIG. 7A is a plan view.

As shown in FIG. 7A, the interconnection pitch is set at 1.1 $\mu$m, the width of interconnection patterns at 0.54 $\mu$m, the interval between interconnection patterns at 0.56 $\mu$m, and the distance, W, between the interconnection patterns and the dummy patterns at 0.56 $\mu$m. The smallest allowable width, a, of the rectangular dummy patterns is set at 0.54 $\mu$m and the smallest allowable area, S, thereof at 0.88 $\mu m^2$. Hereinafter, the dummy patterns which have a width or a smaller area than the allowable magnitude will be referred to as "narrow dummy patterns." The smallest dummy patterns, therefore, measure 0.54 $\mu$m×1.63 $\mu$m.

Figure 8:
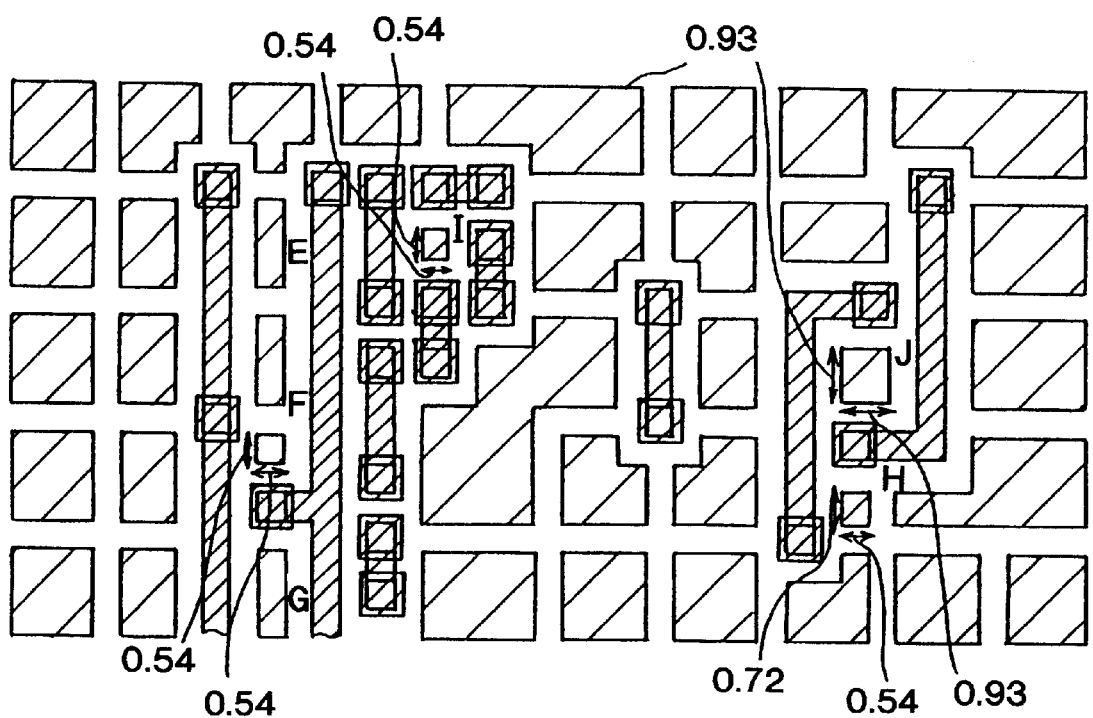
FIG. 8 is a plan view showing a reticle according to a comparative example.

For the purpose of comparison, a reticle produced by a typical conventional method is shown in FIG. 8. FIG. 8 is a plan view. This reticle is unlike that of FIG. 7A solely in respect that the smallest allowable width, a, of the rectangular dummy patterns is set at 0.54 $\mu$m.

Comparison of FIG. 7 and FIG. 8 reveals that it is in the areas E through J that dummy patterns smaller than others exist. While dummy patterns exceeding 0.54 $\mu$m×1.63 $\mu$m invariably exist in all the areas in the reticle of FIG. 7A, such narrow dummy patterns as measure 0.54 $\mu$m×0.54 $\mu$m and 0.54 $\mu$m×0.72 $\mu$m exist in the areas F and H in the reticle of FIG. 8. Then, in the areas I and J which are enclosed with interconnection patterns, no dummy pattern exist in the reticle of FIG. 7A and such narrow dummy patterns as measure 0.54 $\mu$m×0.54 $\mu$m and 0.93 $\mu$m×0.93 $\mu$m exist in the reticle of FIG. 8.

While the transferred patterns obtained by the conventional method are suffered to thin or vanish, the dummy patterns which are obtained in the embodiment under discussion can be infallibly transferred onto a substrate even when a difference in level suffered to occur in the substrate defocuses the beam of light for exposure because narrow dummy patterns smaller than 0.54 $\mu$m×1.63 $\mu$m are absent.

Now, a method for forming interconnection layers on a semiconducting substrate by the use of the reticle mentioned above will be explained below with reference to FIGS. 9A through 9F. A resist mask shown in FIG. 9C has resulted from the transfer of the pattern indicated by the line II—II in FIG. 7A.

Figure 9A:
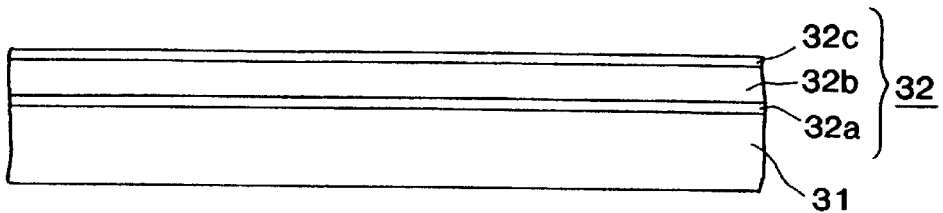
FIGS. 9A–9F is a cross sectional views showing a method for manufacturing a semiconductor device possessed of a interconnection layer and a dummy layer in accordance with one embodiment of this invention.

First, a silicon oxide film is formed on a silicon substrate as shown in FIG. 9A. What is consequently obtained forms a substrate 31. Then, on the silicon oxide film, a TiN film 32a is superposed in a thickness of about 70 nm, An AlCuTi alloy film 32b in a thickness of about 420 nm, and a TiN film 32c in a thickness of about 70 nm sequentially in the order mentioned by sputtering as shown in FIG. 9A.

Figure 9B:
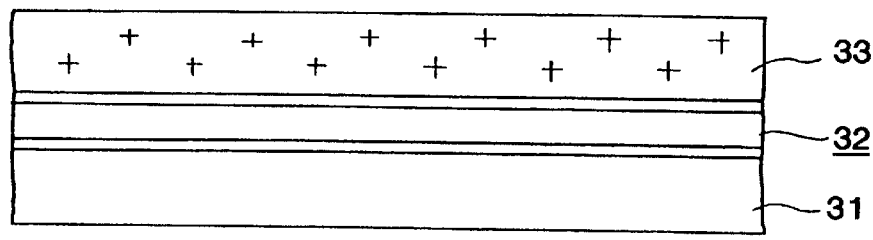

Subsequently, a novolak type positive i line resist is applied by the spin coating technique and a resist film 33 is formed in a thickness of about 1.19 $\mu$m on the TiN film 32c as shown in FIG. 9B. The resist film 33 is dried and cured by heating.

Figure 12:
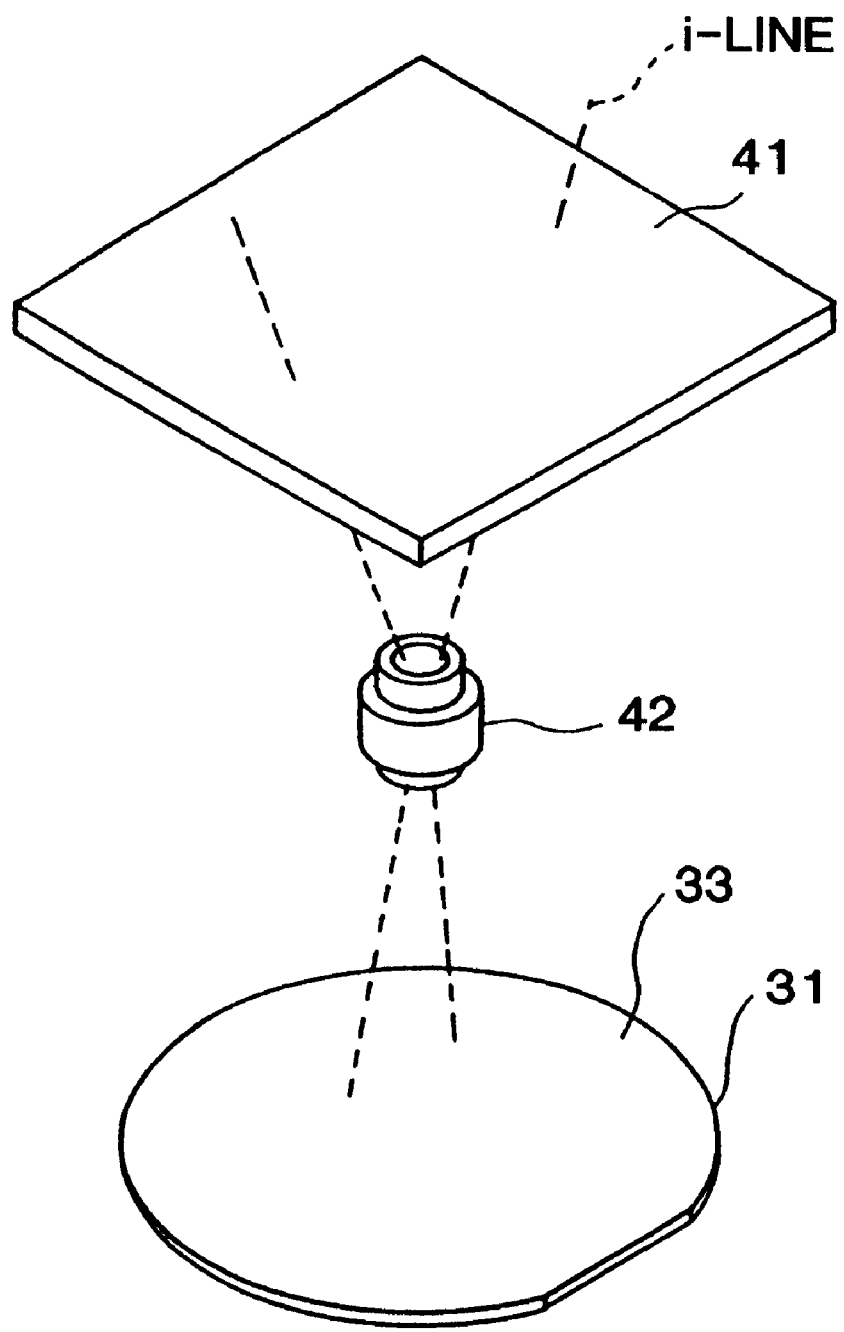
FIG. 12 is a perspective view showing a method for transferring patterns on a wafer with a reduction-type projection printing system using a reticle according to the embodiment of this invention.

Then, the resist film 33 is exposed through the medium of a stepper, as shown in FIG. 12, of an opening ratio (NA) 0.55 to an i line of a wavelength of 0.365 $\mu$m emitted from a high-pressure mercury-vapor lamp for a dosage of 450 msec. At this time, the reticle 41 produced as described above is used as a mask. Symbol 42 in FIG. 12 is a lens system.

Figure 9C:
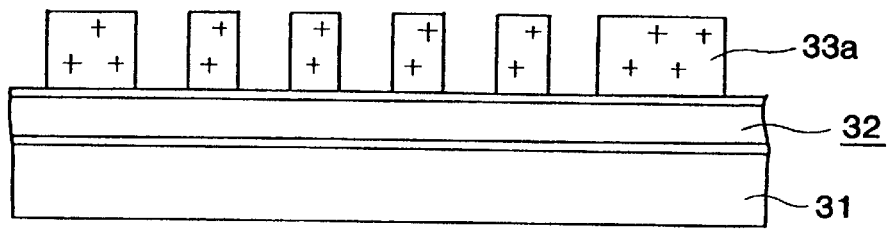
Figure 9D:
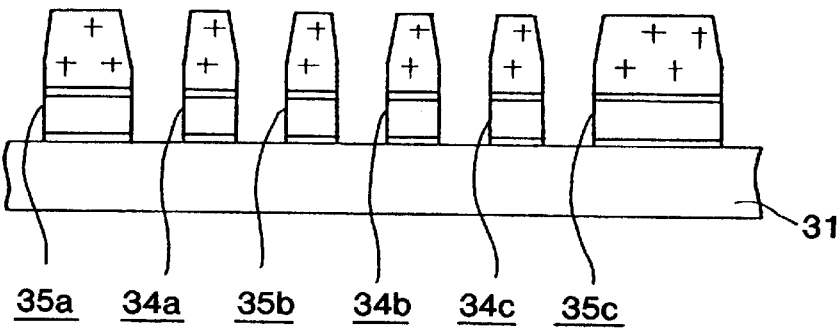
Figure 9E:
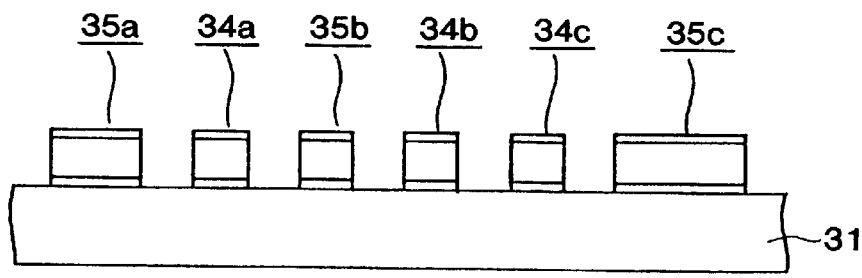

The resist film 33 which has been exposed to the i line is developed with an alkali developer. The development produces a resist mask 33a resulting from the transfer of interconnection patterns and dummy patterns as shown in FIG. 9C.

The resist mask 33a is heated and, at the same time, subjected to an UV irradiation to improve the resistance of the resist mask 33a to etching. Subsequently, by the reactive ion etching using a reactive gas $Cl_2+BCl_3$, the TiN film 32c, the AlCuTi alloy film 32b, and the TiN film 32a are successively removed to give rise to interconnection layers 34a through 34c and dummy layers 35a through 35c.

Then, the remaining resist mask 33a is removed by means of an oxygen plasma usher to expose the interconnection layers 34a through 34c and the dummy layers 35a through 35c.

Figure 9F:
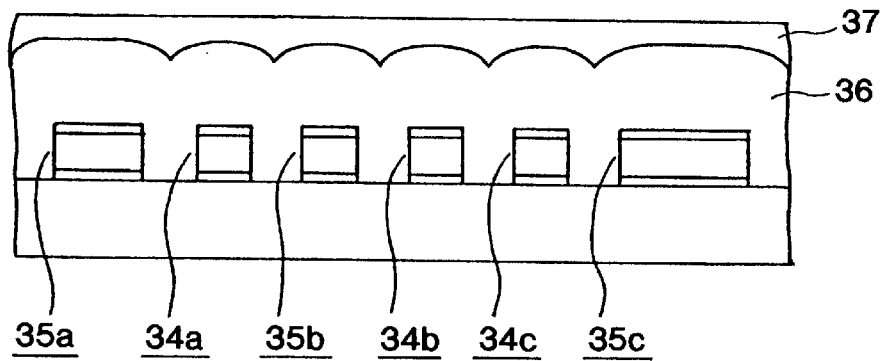
Figure 10A:
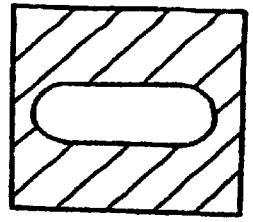
FIGS. 10A–10H are views of minute patterns formed on a substrate to show the relation between the planar shape of a transfer pattern and the focal point of exposure based on dummy patterns according to one embodiment of this invention.
Figure 10B:
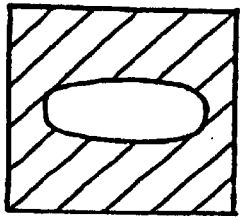
Figure 10C:
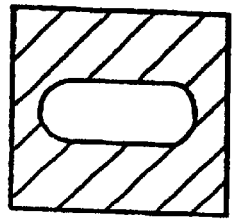
Figure 10D:
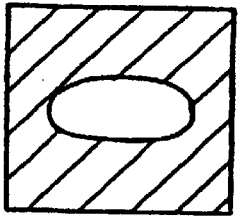
Figure 10E:
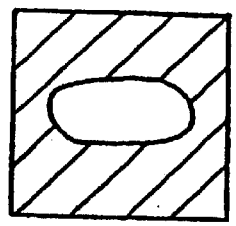
Figure 10F:
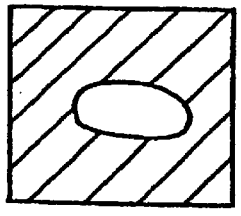
Figure 10G:
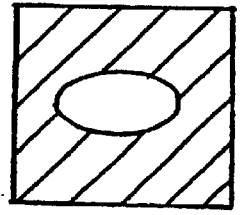
Figure 10H:
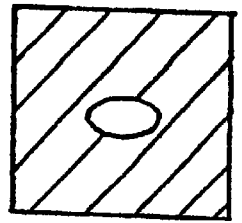
Figure 11A:
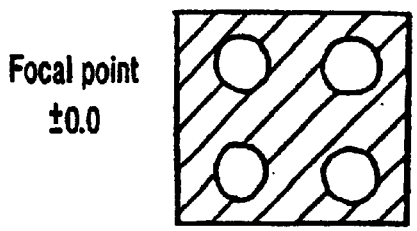
FIGS. 11A–11H are views is a photograph of minute patterns formed on a substrate to show the relation between the planar shape of a transfer pattern and the focal point of exposure based on dummy patterns according to a comparative example.
Figure 11B:
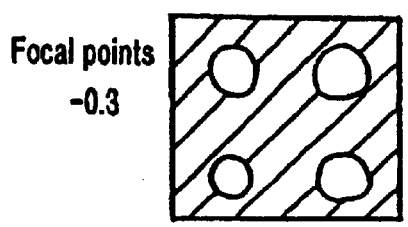
Figure 11C:
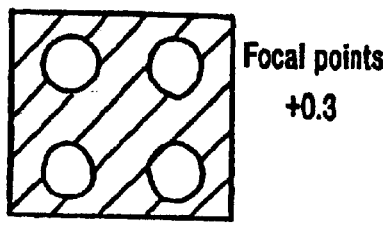
Figure 11D:
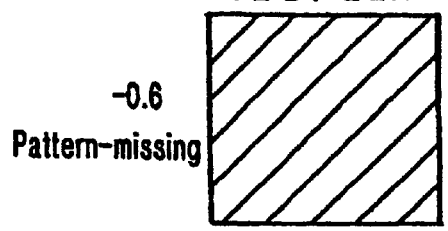
Figure 11E:
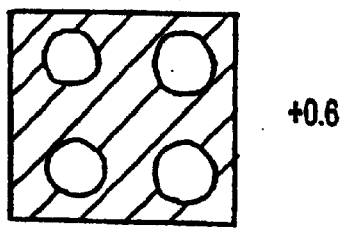
Figure 11F:
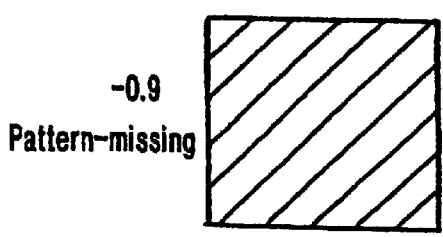
Figure 11G:
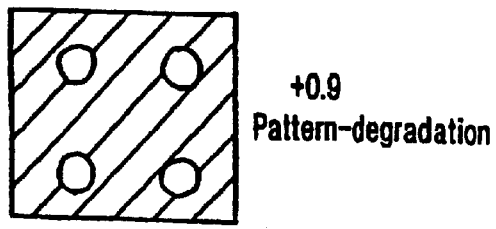
Figure 11H:
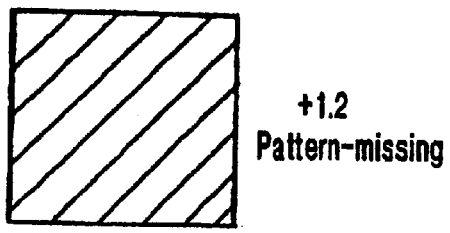

Thereafter, a silicon oxide film 36 is formed by the CVD technique to cover the interconnection layers 34a through 34c and the dummy layers 35a through 35c and then a SOG film 37 is formed thereon by the coating technique to flatten the silicon oxide film 36 as shown in FIG. 9F.

The reticle which is produced by the method for forming a pattern as described in the embodiment above is used in the production of a semiconductor device according to the method of this invention as described above. Since the reticle widens the range of the focal point of the ray of light for exposure in which the transferred patterns are allowed to remain infallibly, the dummy patterns can be transferred without fail onto a substrate 31 and the occurrence of a missing portion in the pattern can be prevented even when a difference in level is suffered to occur in the substrate 31. As a result, the silicon oxide film (insulating film) 36 or the SOG film (insulating film) 37 which coats the interconnection layers 34a through 34c can be flattened.

Further, since the isolated dummy patterns which satisfy the standard of width and do not satisfy the standard of area are removed at the time of designing a reticle, the formation of dummy layers which are thinned by the thinning of the transferred patterns based on such dummy patterns as mentioned above can be prevented. As a result, such electrical defects as short circuits which are caused by separated conductive substances can be prevented.

In the method of this invention for forming a pattern, the dummy patterns are partially removed to obtain separated groups of dummy patterns and these separated groups of dummy patterns are examined to determine not merely the smallest allowable width, a, but also the smallest allowable area, S, and the widths and consequently the areas of narrow dummy patterns are enlarged or the isolated narrow dummy patterns which are lower than the standards are removed as described above.

Even the patterns which have the square of the smallest allowable width, a, as the area thereof and which are allowed to remain intact by the conventional method and suffered to form a cause for a missing portion in a pattern are either enlarged in area or removed when they do not satisfy the smallest allowable area, S. As a result, the dummy patterns can be infallibly transferred onto a substrate or the transferred patterns can be prevented from thinning even when the beam of light for exposure is defocussed by a difference in level of the surface of the substrate.

According to this invention of the method for manufacturing a semiconductor device, since the interconnection patterns and the dummy patterns are transferred by means of the reticle described above, the dummy patterns can be transferred onto the substrate without error and the occurrence of a missing portion in a pattern can be precluded. Since the interconnection layers and the dummy layers can be formed as distributed at a suitable density by such transferred patterns as mentioned above, the insulating films which coat these layers can be flattened.

Further, since the isolated dummy patterns which satisfy the standard of width and do not satisfy the standard of area are removed, the formation of dummy layers which are thinned by the thinning of the transferred patterns can be prevented. As a result, such electrical defects as short circuits causable by a separated conductive substance can be precluded.

What is claimed is:

1. A method of manufacturing a semiconductor device comprising:

exposing a photo sensitive film formed on a conductive film through a medium of a reticle designed by generating main patterns and first dummy patterns separated with intervals from the main patterns, dividing each of said first dummy patterns into a plurality of spaced apart second dummy patterns, measuring each of said second dummy patterns to find third dummy patterns having respective widths and areas below respective smallest allowable values, and connecting respectively each third dummy pattern which is adjacent to a second dummy pattern with the adjacent second dummy pattern by generating a connecting dummy pattern;

developing the exposed photosensitive film thereby to form an etchant-resistant mask in conformity with said main patterns and said dummy patterns; and removing by etching said conductive film with said etchant-resistant mask thereby to form an interconnection layer and a dummy layer.

2. The method according to claim 1, wherein said photosensitive film is a resist film.

3. The method according to claim 2, wherein the developing is developing the exposed photo-sensitive film on a reduced scale with respect to said main patterns and said dummy patterns.

4. The method according to claim 1, which further comprises forming an insulating film thereby to cover said interconnection layer and said dummy layer subsequently to said forming said interconnection layer and said dummy layer.

5. The method according to claim 1, wherein the reticle substantially guarantees transfer of the dummy pattern to the semiconductor device even if a surface level of a substrate is different along a surface of the semiconductor device.

6. The method according to claim 1, further comprising curing said photo-sensitive film.

* * * * *